United States Patent
Cohen et al.

(10) Patent No.: US 9,390,980 B1
(45) Date of Patent: Jul. 12, 2016

(54) III-V COMPOUND AND GERMANIUM COMPOUND NANOWIRE SUSPENSION WITH GERMANIUM-CONTAINING RELEASE LAYER

(71) Applicant: International Business Machines Corporation, Armonk, NY (US)

(72) Inventors: Guy M. Cohen, Ossining, NY (US); Isaac Lauer, Yorktown Heights, NY (US); Alexander Reznicek, Troy, NY (US); Jeffrey W. Sleight, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/666,520

(22) Filed: Mar. 24, 2015

(51) Int. Cl.
| | |
|---|---|
| *H01L 21/8238* | (2006.01) |
| *H01L 51/40* | (2006.01) |
| *H01L 29/06* | (2006.01) |
| *H01L 21/306* | (2006.01) |
| *H01L 21/311* | (2006.01) |
| *H01L 29/66* | (2006.01) |
| *H01L 29/161* | (2006.01) |
| *H01L 29/201* | (2006.01) |
| *H01L 27/092* | (2006.01) |
| *H01L 21/02* | (2006.01) |

(52) U.S. Cl.
CPC .. *H01L 21/823807* (2013.01); *H01L 21/02532* (2013.01); *H01L 21/02603* (2013.01); *H01L 21/02636* (2013.01); *H01L 21/30608* (2013.01); *H01L 21/31116* (2013.01); *H01L 27/092* (2013.01); *H01L 29/0673* (2013.01); *H01L 29/161* (2013.01); *H01L 29/201* (2013.01); *H01L 29/66477* (2013.01)

(58) Field of Classification Search
CPC ............... H01L 21/823807; H01L 21/30608; H01L 21/31116; H01L 21/02603; H01L 21/02636
USPC .......................................... 438/199; 977/938
See application file for complete search history.

(56) References Cited

U.S. PATENT DOCUMENTS

| | | | |
|---|---|---|---|
| 7,888,753 | B2 | 2/2011 | Afzali-Ardakani et al. |
| 8,349,667 | B2 * | 1/2013 | Saracco ................ B82Y 10/00 257/E21.123 |
| 8,445,348 | B1 * | 5/2013 | Kuo .................. H01L 29/42392 257/287 |
| 8,513,125 | B2 * | 8/2013 | Saracco ................ B82Y 10/00 216/11 |
| 8,580,624 | B2 | 11/2013 | Bangsaruntip et al. |
| 9,224,810 | B2 * | 12/2015 | Kim ..................... H01L 27/092 |
| 2011/0012090 | A1 * | 1/2011 | Singh .................... B82Y 10/00 257/24 |
| 2011/0059598 | A1 | 3/2011 | Saracco et al. |
| 2011/0095267 | A1 | 4/2011 | Bryant et al. |
| 2012/0168711 | A1 | 7/2012 | Crowder et al. |

(Continued)

*Primary Examiner* — Long K Tran
(74) *Attorney, Agent, or Firm* — David B. Woycechowsky

(57) ABSTRACT

A device that includes: a substrate layer; a first set of source/drain component(s) defining an nFET (n-type field-effect transistor) region; a second set of source/drain component(s) defining a pFET (p-type field-effect transistor) region; a first suspended nanowire, at least partially suspended over the substrate layer in the nFET region and made from III-V material; and a second suspended nanowire, at least partially suspended over the substrate layer in the pFET region and made from Germanium-containing material. In some embodiments, the first suspended nanowire and the second suspended nanowire are fabricated by adding appropriate nanowire layers on top of a Germanium-containing release layer, and then removing the Germanium-containing release layers so that the nanowires are suspended.

16 Claims, 4 Drawing Sheets

(56) References Cited

U.S. PATENT DOCUMENTS

| | | |
|---|---|---|
| 2012/0199812 A1 | 8/2012 | Baykan et al. |
| 2014/0091279 A1 | 4/2014 | Kachian et al. |
| 2014/0203238 A1 | 7/2014 | Chang et al. |
| 2014/0203290 A1 | 7/2014 | Chang et al. |

* cited by examiner

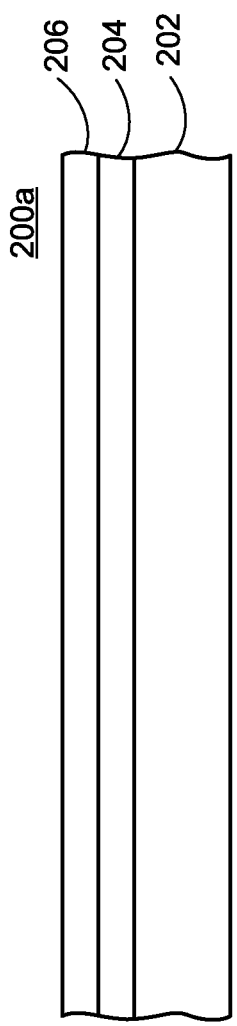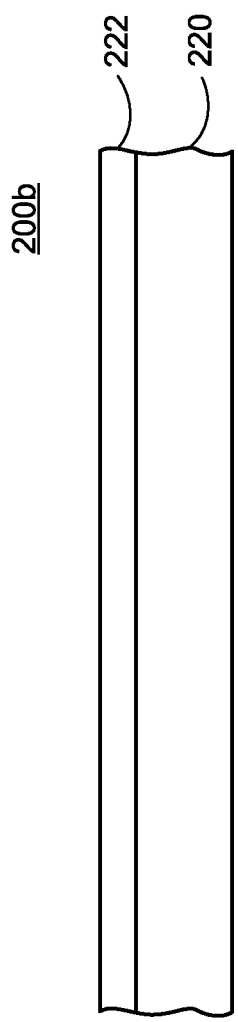
Fig. 2A
Fig. 2B

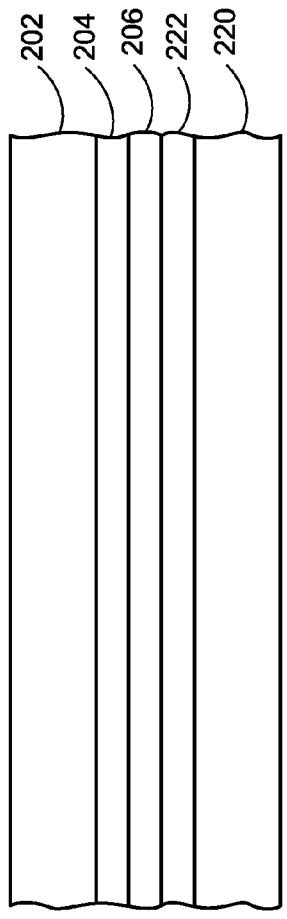
Fig. 2C
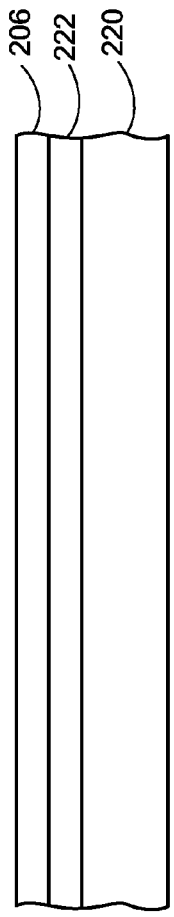
Fig. 2D
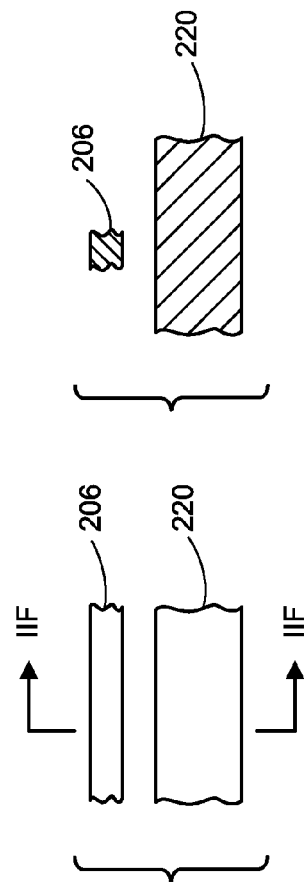
Fig. 2E
Fig. 2F

III-V COMPOUND AND GERMANIUM COMPOUND NANOWIRE SUSPENSION WITH GERMANIUM-CONTAINING RELEASE LAYER

BACKGROUND OF THE INVENTION

The present invention relates generally to the field of nanowire type semiconductor devices, and more particularly to nanowire type semiconductor devices with a "release layer" (that is, a layer that underlies and supports a nanowire when the nanowire structure is first formed, but is then removed so that the nanowire is suspended without any material underlying and supporting the nanowire's suspended sections). It is known to make semiconductor devices that include nanowire portions. For example, some transistors use nanowire to form the gate portion of the transistor. The "release" of nanowire devices is a key step in the fabrication process. More specifically, "releasing" a nanowire in a nanowire type semiconductor device refers to a fabrication process where a nanowire is initially formed on the top surface of another layer (that is, the "release layer;" and (ii) the release layer, or at least a portion of the release layer, is removed (or released) from underneath the nanowire (without removing the nanowire); and (iii) as a result, the nanowire is suspended over the area where the release layer used to be.

It is known to use "III-V compounds" as semiconductor material in semiconductor devices. Exemplary, and most commonly used III-V semiconductor materials include, but are not limited to, gallium arsenide (GaAs), indium phosphide (InP) and indium gallium arsenide (InGaAs). Any other binary, ternary or other combination of III-V semiconductors can be used.

SUMMARY

According to an aspect of the present invention, a method of at least partially making a semiconductor device includes the following steps (not necessarily in the following order): (i) providing a first sub-assembly including a substrate layer, a Germanium-containing layer formed on at least a portion of a top surface of the substrate layer, a III-V material nanowire layer located on a portion of a top surface of the Germanium-containing layer, a Silicon-Germanium (SiGe) nanowire layer located on a portion of the top surface of the Germanium-containing layer; and (ii) refining the first sub-assembly into a second sub-assembly by removing the Germanium-containing layer so that: (a) the III-V material nanowire layer is at least partially suspended above the substrate layer, and (b) the SiGe nanowire layer is at least partially suspended above the substrate layer.

According to a further aspect of the present invention, a method of at least partially making a semiconductor device includes the following steps (not necessarily in the following order): (i) providing a first sub-assembly including a first handle wafer, a first Germanium-containing layer formed on at least a portion of a top surface of the first handle wafer, and a III-V material nanowire layer located on a portion of a top surface of the first Germanium-containing layer, with the first Germanium containing layer being optimized for III-V material growth so that the III-V material layer has relatively low tensile strain; (ii) providing a second sub-assembly including a second handle wafer, and a second Germanium-containing layer formed on at least a portion of a top surface of the second handle wafer, with the second Germanium containing layer being optimized for use as a seed layer for p-type field-effect transistor gate material growth; (iii) refining the first and second sub-assemblies into a third sub-assembly by wafer bonding the first sub-assembly onto a top surface of the second sub-assembly so that the third sub-assembly includes the second handle wafer, the second Germanium-containing layer formed on at least a portion of the top surface of the second handle wafer, and the III-V material nanowire layer located on a portion of a top surface of the second Germanium-containing layer; (iv) refining the third sub-assembly into a fourth sub-assembly by replacing a portion of the III-V material nanowire layer with a Silicon-Germanium (SiGe) nanowire layer, with the SiGe nanowire layer being located over at least a portion of the top surface of the second Germanium-containing layer; and (v) refining the fourth sub-assembly into a fifth sub-assembly by removing the second Germanium-containing layer so that: (a) the III-V material nanowire layer is at least partially suspended above the second handle wafer, and (b) the SiGe nanowire layer is at least partially suspended above the second handle wafer layer.

According to a further aspect of the present invention, a semiconductor device includes: (i) a substrate layer; (ii) a first set of source/drain component(s) defining an nFET (n-type field-effect transistor) region in the substrate layer; (iii) a second set of source/drain component(s) defining a pFET (p-type field-effect transistor) region in the substrate layer; (iv) a first suspended nanowire, at least partially suspended over the substrate layer in the nFET region, made from III-V material, and electrically connected to act as a gate for the first set of source/drain component(s); and (v) a second suspended nanowire, at least partially suspended over the substrate layer in the pFET region, made from Silicon-Germanium (SiGe), and electrically connected to act as a gate for the second set of source/drain component(s).

BRIEF DESCRIPTION OF THE DRAWINGS

FIG. 2A is a longitudinal cross-sectional view (cross-hatching omitted for clarity of illustration purposes) of a first intermediate sub-assembly used in making a second embodiment of a semiconductor device according to the present invention;

FIG. 2B is a longitudinal cross-sectional view (cross-hatching omitted for clarity of illustration purposes) of a second intermediate sub-assembly used in making the second embodiment semiconductor device;

FIG. 2C is a longitudinal cross-sectional view (cross-hatching omitted for clarity of illustration purposes) of a third intermediate sub-assembly used in making the second embodiment semiconductor device;

FIG. 2D is a longitudinal cross-sectional view (cross-hatching omitted for clarity of illustration purposes) of a fourth intermediate sub-assembly used in making the second embodiment semiconductor device;

FIG. 2E is a longitudinal cross-sectional view (cross-hatching omitted for clarity of illustration purposes) of a fifth intermediate sub-assembly used in making the second embodiment semiconductor device; and FIG. 2F is a transvers cross-sectional view (cross-hatching shown for clarity of illustration purposes) of the fifth intermediate sub-assembly used in making the second embodiment semiconductor device.

DETAILED DESCRIPTION

Figure 1A:
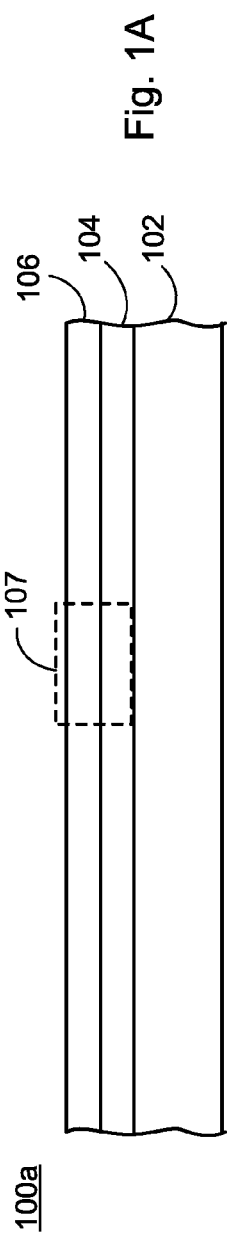
FIG. 1A is a longitudinal cross-sectional view (cross-hatching omitted for clarity of illustration purposes) of a first intermediate sub-assembly used in making a first embodiment of a semiconductor device according to the present invention.

Some embodiments of the present invention are directed to a device that includes: a substrate layer; a first set of source/drain component(s) defining an nFET (n-type field-effect transistor) region; a second set of source/drain component(s) defining a pFET (p-type field-effect transistor) region; a first suspended nanowire, at least partially suspended over the substrate layer in the nFET region and made from III-V material; and a second suspended nanowire, at least partially suspended over the substrate layer in the pFET region and made from Germanium-containing material. In some embodiments, the first suspended nanowire and the second suspended nanowire are fabricated by adding appropriate nanowire layers on top of a Germanium-containing release layer, and then removing the Germanium-containing release layers so that the nanowires are suspended.

In some embodiments, a fabrication method for making suspended nanowire type semiconductor devices: (i) includes making nanowires from III-V compounds; and (ii) uses a Germanium-containing (Ge-containing) layer as the release layer (which is at least partially removed during fabrication) for the suspended III-V compound suspended nanowires. "Lattice matching" is a helpful technique that can be used in conjunction with III-V suspended nanowire/Germanium-containing release layer fabrication processes. Semiconductor materials generally have a crystalline structure where atoms are in a regular lattice characterized by a lattice constant. Lattice matching attempts to match (or at least come close to matching) lattice constants for two semiconductor materials that will be mixed and/or located adjacent to each other. For example: (i) GaAs is a III-V semiconductor material with a lattice constant of 5.65325 A (angstroms); and (ii) Germanium is a material used in semiconductor devices that has a lattice constant of 5.658 A; and (iii) because the lattice constant values of GaAs and Germanium are quite close, these materials are considered to be lattice-matched for most purposes.

In some embodiments of the present invention, a Germanium (Ge), or Silicon-Germanium (or SiGe) layer is used as a release layer. Herein, a Germanium release layer and/or a SiGe release layer will collectively be referred to as a "Germanium-containing release layer." In some embodiments of the present invention, the Germanium-containing release layer is selectively etched, meaning that the Germanium or SiGe release layer (or Germanium or SiGe portions of a release layer) are released by etching with an etching agent that removes the Germanium and/or SiGe without removing other materials in the intermediate suspended nanowire type semiconductor sub-assembly that is being fabricated.

The material used to make the handle wafer can be graded to up to pure Germanium. To explain, as used in this document, the term "grading SiGe" refers to increasing Germanium content of a SiGe layer, up to a maximum grading of pure Germanium with no Silicon. For example, 10% grade SiGe would have 10% Germanium and 90% Silicon in its alloy make-up.

Figure 1B:
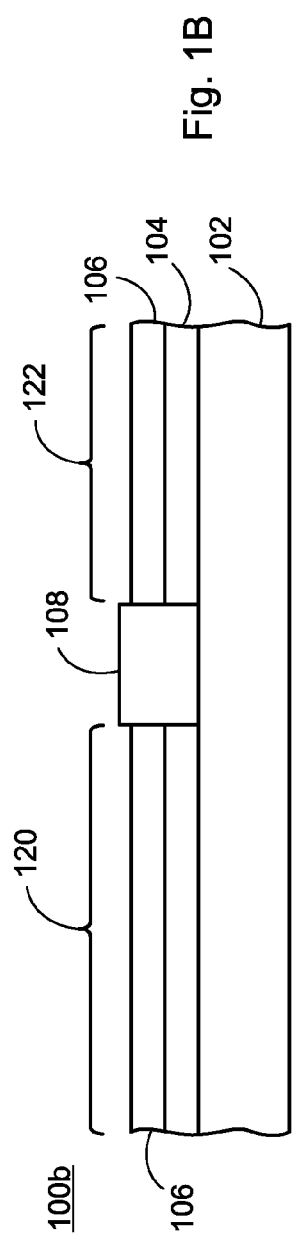
FIG. 1B is a longitudinal cross-sectional view (cross-hatching omitted for clarity of illustration purposes) of a second intermediate sub-assembly used in making the first embodiment semiconductor device.
Figure 1C:
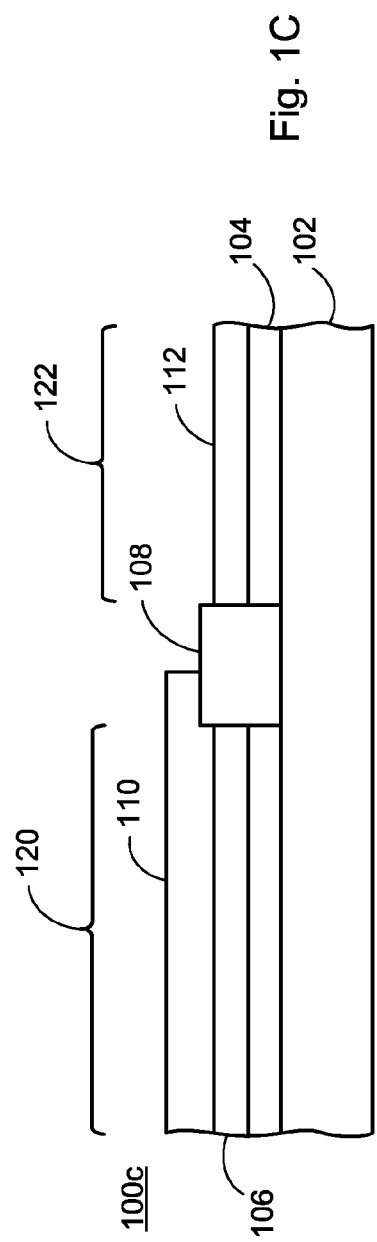
FIG. 1C is a longitudinal cross-sectional view (cross-hatching omitted for clarity of illustration purposes) of a third intermediate sub-assembly used in making the first embodiment semiconductor device.

FIGS. 1A to 1C show a first process flow for fabricating a nanowire type semiconductor device 100. More specifically: (i) FIG. 1A shows first intermediate sub-assembly 100a; (ii) FIG. 1B shows second intermediate sub-assembly 100b; and (iii) FIG. 1C shows third intermediate sub-assembly 100c.

As shown in FIG. 1A, first intermediate sub-assembly 100a includes: handle wafer 102; Germanium-containing release layer 104; III-V compound nanowire layer 106; and dotted line region 107. In this example: (i) the handle wafer layer is made of pure silicon, several hundred microns thick; (ii) the Germanium-containing release layer is made of relatively Germanium-rich SiGe (alternatively, it could be made of pure Ge) 4-8 nm (nanometers) thick; and (iii) the III-V compound nanowire layer is made of appropriate III-V compound 4 to 8 nm thick (other embodiments may range between 2 to 20 nm thick).

Starting with intermediate sub-assembly 100a, the following operations are performed in order to form an oxide isolation region: (i) pad nitride; (ii) etch a trench (see dotted line region 107 showing where the trench is etched); (iii) deposit oxide stop 108 (see FIG. 1B); (iv) polish to pad; and (v) strip pad. This process of forming an oxide isolation region will now be described in more detail in the following paragraphs.

With respect to operation (i), the nitride pad that is deposited in this step is not shown in the Figures, but those of skill in the art will appreciate that pad nitride is a standard STI (shallow trench isolation) process. In this embodiment, the specific nitride used in the pad nitride operation is silicon nitride. More specifically, in this embodiment, the pad nitride operation is performed by plasma-enhanced chemical vapor deposition (PECVD), which is an STI process used to create active regions. More specifically, the nitride pad is helpful in creating an NFET (n-type field-effect transistor) region 120 (see FIG. 1C) to the left hand side of dotted line region 107 and a PFET (p-type field-effect transistor) region 122 (see FIG. 1C) to the right hand side of dotted line region 107.

With respect to operation (ii) (etch a trench), the process used to remove material and make the trench is RIE (reactive ion etching). As indicated by dotted line region 107 in FIG. 1A, the trench extends downward into Germanium-containing layer 104.

With respect to operation (iii), oxide stop 108 is deposited in the trench previously formed at operation (ii) according to currently conventional processes for depositing oxide stops.

With respect to "polish to pad" operation (iv), chemical-mechanical planarization (CMP) is performed to do a top-down removal of material, downwards from the top surface of the nitride pad (not shown in the Figures). The top surface of oxide stop 108 stops top-down removal of material by the CMP of operation (iv) so that the nitride pad (not shown in the Figures) will be flat and level and will have an appropriate height). More specifically, oxide stop 108 prevents the CMP of operation (iv) from removing material from III-V compound nanowire layer 106 (which layer 106 is, in this example, only 4 to 8 nanometers in thickness, and therefore not feasibly susceptible to conventional CMP processes).

At strip pad, step (v), the nitride pad (not shown in the Figures) is removed by a conventional stripping process to complete shallow trench isolation and thereby create the NFET and PFET regions. After operations (i) to (v) of the process of forming an oxide isolation region, intermediate sub-assembly 100b of FIG. 1B is obtained. Intermediate sub-assembly 100b includes: handle wafer 102; Germanium-containing release layer 104; III-V compound nanowire layer 106; and oxide stop 108. As shown in FIG. 1B, oxide stop 108 now separates III-V compound layer 106 into two regions 120 and 122.

In order to get from intermediate sub-assembly 100b of FIG. 1B to intermediate sub-assembly 100c of FIG. 1C, a SiGe nanowire layer forming process is performed. SiGe nanowire layer forming process includes the following operations: (i) pattern with hardmask (for example SiN or SiO2 hardmask material); (ii) etch III-V compound nanowire layer away in region 122 (but not region 120); and (iii) grow SiGe nanowire layer 112 (see FIG. 1C). The steps of the SiGe nanowire layer forming process will be discussed in the following paragraphs.

At operation (i) of the SiGe nanowire layer forming process, hardmask layer 110 is applied in region 120, but not region 122, by conventional hardmask application processes.

At operation (ii) of the SiGe nanowire layer forming process, the III-V compound nanowire layer is etched away in region 122, but not region 120 (where it is protected from etching by hardmask layer 110). The choice of etching chemicals strongly depends on the III-V compound that is being used, as will be appreciated by those of skill in the art. For example, the etching chemical could be: (i) HF in the case of GaAs or InGaAs; or (ii) HCl in the case of InP.

At operation (iii) of the SiGe nanowire layer forming process, SiGe nanowire layer 112 is grown on top of Germanium-containing release layer 104 in region 122 (see FIG. 1C). SiGe nanowire layer 112 is relatively Germanium-poor relative to SiGe release layer 104. To the extent pure silicon may be used for nanowire layer 112, pure silicon should be considered as a type of "SiGe layer" for making nanowires under the present disclosure. This will become important later when SiGe release layer 104 is removed (that is, released). In this embodiment, SiGe nanowire layer 112 is grown by epitaxial growth, but it may be added by any process that is currently conventional or to be developed in the future. In this embodiment, layer 112 is 2-20 nm in thickness, with 4-8 nm preferred. During the Germanium-containing nanowire layer growing step, Germanium-containing release layer 104 underlies and supports SiGe nanowire layer 112. At the end of the SiGe nanowire growing step (iii), intermediate sub-assembly 100c of FIG. 1C is obtained.

Figure 1D:
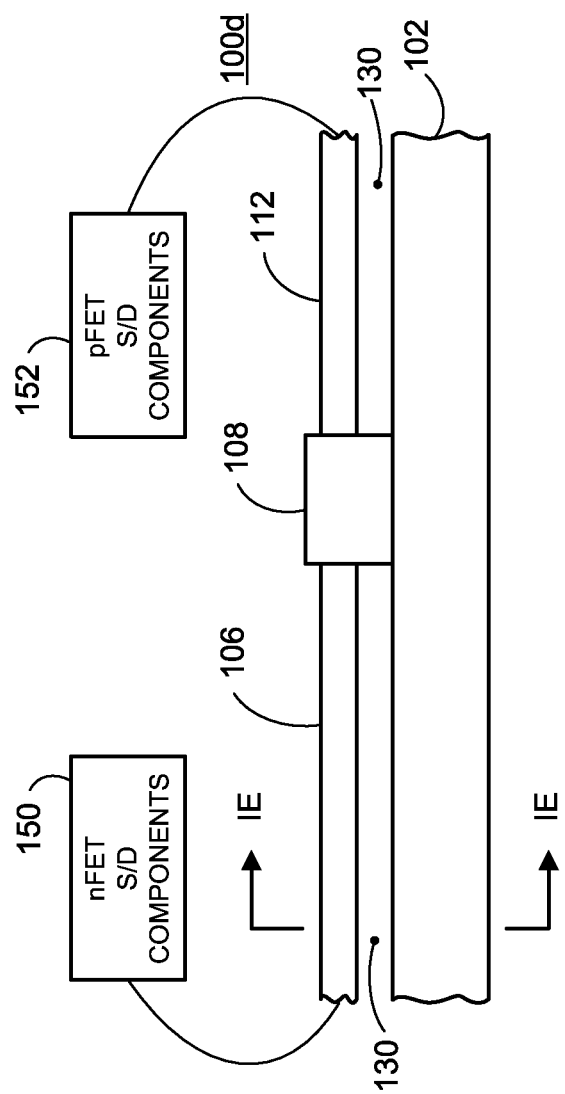
FIG. 1D is a longitudinal cross-sectional view (cross-hatching omitted for clarity of illustration purposes) of a fourth intermediate sub-assembly used in making the first embodiment semiconductor device.

After the SiGe nanowire layer forming process described above, hardmask layer 110 is removed by conventional processes (compare intermediate sub-assembly 100c of FIG. 1C to intermediate sub-assembly 100d of FIG. 1D). Then a touch-up CMP is performed to planarize the top surfaces of III-V compound nanowire layer 106 and SiGe nanowire layer 112. Once again, the top surface of oxide stop 108 acts as a stop for the touch-up CMP.

A comparison of intermediate sub-assembly 100c of FIG. 1C and intermediate sub-assembly 100d of FIG. 1D shows the release of Germanium-containing release layer 104, which results in suspension of III-V compound nanowire layer 106 and SiGe nanowire layer 112. As shown in FIG. 1D, suspension zone 130 is now free of material so that the III-V compound nanowire layer and the Germanium-containing nanowire layer are suspended above handle wafer 102 and unsupported on their respective undersides.

More specifically, in this embodiment, the Germanium-containing release layer is removed (or "released") by a wet etch process. The relatively high Germanium content, relative to the Germanium content of the nanowire layer, helps in selectively removing the release layer without harming the Germanium-containing nanowire layer because high Germanium content portions can be wet etched without substantial etching, or damage, to relatively low Germanium content (SiGe) portions. In order for selective etching to work, there is typically a Germanium content difference of at least 20-30% as between the SiGe release layer and the SiGe nanowire layer.

Figure 1E:
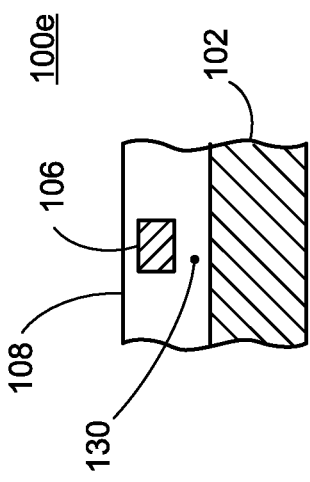
FIG. 1E is a transverse cross-sectional view (cross-hatching shown for clarity of illustration purposes) of the fourth intermediate sub-assembly used in making the first embodiment semiconductor device.

As shown in orthogonal left side view 100e of FIG. 1E (see, cross-section arrows in FIG. 1D for viewer orientation), III-V compound nanowire layer 106 has a rectangular cross-section in this embodiment. Alternatively, the suspended nanowires may be profiled (for example, by annealing) to have other shapes, such as a circular cross-section. Nanowires 106 and 112 may be incorporated as gate regions in a field-effect transistor (FET) device, with: (i) III-V compound nanowire 106 serving as a gate for the nFET portion (also called nFET region) of the semiconductor device; and (ii) SiGe nanowire 112 serving as a gate for a pFET portion (also called pFET region) of the semiconductor device. The source/drain components for the pFET and nFET regions (see FIG. 1D at blocks 150 and 152) are only shown in schematic form because these are structured and located similarly to source/drain components of known nFET/pFET semiconductor devices in this embodiment. A variation on the semiconductor device fabrication method, discussed above, will now be discussed with reference to FIGS. 2A to 2C. This method implements a wafer bonding approach to address strain engineering of the PFET region. The process begins by providing first sub-assembly 200a as shown in FIG. 2A and second sub-assembly 200b as shown in FIG. 2B. First sub-assembly 200a includes: first handle wafer layer 202; first Germanium-containing layer 204 (in this embodiment SiGe with atomic proportions and/or doping to be optimized for interface with a III-V material layer); and III-V material layer 206. Second sub-assembly 200b includes: second handle wafer layer 220; and second Germanium-containing layer 222 (in this embodiment SiGe with atomic proportions and/or doping to be optimized for use as a seed layer for a PFET).

First and second sub-assemblies 200a and 200b are "wafer bonded" together (that is, put together in the manner of two slices of bread making a sandwich) to make third sub-assembly as shown in FIG. 2C. Note that the first and second wafer layers are, respectively, the top and bottom exterior layers of the third sub-assembly as shown in FIG. 2C. The third sub-assembly is refined to make a fourth sub-assembly as will now be discussed. First handle wafer layer 202 and first Germanium-containing layer 204 are removed from the top of the third sub-assembly (as shown in FIG. 2C) to yield a fourth sub-assembly (as shown in FIG. 2D). The fourth sub-assembly (as shown in FIG. 2D) is structurally similar to first intermediate assembly 100a, which is the starting workpiece for the process discussed in connection with the FIG. 1 series of Figures. However, in this variation shown in the FIG. 2 series of Figures, the fact that III-V material layer 206 was initially grown and/or deposited on a layer optimized for III-V material interface (specifically first Germanium-containing layer 204), means that III-V material layer 206 may be subject to less adverse tensile stresses and/or strains than III-V material layer 106 from the FIG. 1 series of Figures.

The fourth sub-assembly (as shown in FIG. 2D) is then taken through processing similar to that discussed above in connection with FIGS. 1A to 1E so that second Germanium containing layer 222 is released and III-V material layer 206 is suspended as a suspended nanowire above second handle wafer layer 220 (see FIGS. 2E and 2F).

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

The following paragraphs set forth some definitions for certain words or terms for purposes of understanding and/or interpreting this document.

Present invention: should not be taken as an absolute indication that the subject matter described by the term "present invention" is covered by either the claims as they are filed, or by the claims that may eventually issue after patent prosecution; while the term "present invention" is used to help the reader to get a general feel for which disclosures herein are believed to potentially be new, this understanding, as indicated by use of the term "present invention," is tentative and provisional and subject to change over the course of patent prosecution as relevant information is developed and as the claims are potentially amended.

Embodiment: see definition of "present invention" above—similar cautions apply to the term "embodiment."

And/or: inclusive or; for example, A, B "and/or" C means that at least one of A or B or C is true and applicable.

Above: directly above, and/or indirectly above; for example, if a table has a tablecloth, and a glass is held "above" the tablecloth, then the glass will also be considered to be held "above" the table, as the word "above" is hereby defined.

What is claimed is:

1. A method of at least partially making a semiconductor device, the method comprising:
    providing a first sub-assembly including a substrate layer, a Germanium-containing layer formed on at least a portion of a top surface of the substrate layer, a III-V material nanowire layer located on a portion of a top surface of the Germanium-containing layer, a Silicon-Germanium (SiGe) nanowire layer located on a portion of the top surface of the Germanium-containing layer;
    refining the first sub-assembly into a second sub-assembly by removing the Germanium-containing layer so that: (i) the III-V material nanowire layer is at least partially suspended above the substrate layer, and (ii) the SiGe nanowire layer is at least partially suspended above the substrate layer;
    electrically connecting the III-V material nanowire layer to a first set of source/drain components so that the III-V material nanowire layer acts as a gate for an n-type field effect transistor (nFET); and
    electrically connecting the SiGe nanowire layer to a second set of source/drain components so that the SiGe nanowire layer acts as a gate for a p-type field effect transistor (pFET).

2. The method of claim 1 wherein the first sub-assembly further includes a hard mask material layer located at least substantially on a top surface of the III-V material nanowire layer, the method further comprising:
    refining the second sub-assembly into a third sub-assembly by stripping the hardmask material layer away from the second sub-assembly.

3. The method of claim 1 wherein:
    the first sub-assembly further includes an oxide stop located on the top surface the substrate layer and in between the III-V material nanowire layer and the Germanium-containing nanowire layer;
    in the second sub-assembly, a first end of the III-V material nanowire layer is supported, at least in part, by the oxide stop; and
    in the second sub-assembly, a first end of the SiGe nanowire layer is supported, at least in part, by the oxide stop.

4. The method of claim 1 wherein the substrate is a handle wafer that is graded to Ge.

5. The method of claim 1 wherein the III-V material used to make the III-V material nanowire layer is at least substantially lattice matched to a material used to make the Germanium-containing layer.

6. The method of claim 1 wherein a material used to make the Germanium-containing layer has a higher proportion of Germanium than the SiGe nanowire layer.

7. The method of claim 1 wherein a material used to make the Germanium-containing layer has a higher proportion of Germanium than the SiGe nanowire layer by at least 20 percent.

8. The method of claim 1 wherein the removal of the Germanium-containing layer is performed by a wet etch process.

9. The method of claim 1 wherein the removal of the Germanium-containing layer is performed by a wet etch process without any substantial removal of material from the SiGe nanowire layer.

10. A method of at least partially making a semiconductor device, the method comprising:
    providing a first sub-assembly including a first handle wafer, a first Germanium-containing layer formed on at least a portion of a top surface of the first handle wafer, and a III-V material nanowire layer located on a portion of a top surface of the first Germanium-containing layer, with the first Germanium containing layer being optimized for III-V material growth so that the III-V material layer has relatively low tensile strain;
    providing a second sub-assembly including a second handle wafer, and a second Germanium-containing layer formed on at least a portion of a top surface of the second handle wafer, with the second Germanium containing layer being optimized for use as a seed layer for p-type field-effect transistor gate material growth;
    refining the first and second sub-assemblies into a third sub-assembly by wafer bonding the first sub-assembly onto a top surface of the second sub-assembly so that the third sub\-assembly includes the second handle wafer, the second Germanium-containing layer formed on at least a portion of the top surface of the second handle wafer, and the III-V material nanowire layer located on a portion of a top surface of the second Germanium-containing layer; refining the third sub-assembly into a fourth sub-assembly by replacing a portion of the III-V material nanowire layer with a Silicon-Germanium (SiGe) nanowire layer, with the SiGe nanowire layer being located over at least a portion of the top surface of the second Germanium-containing layer;
    refining the fourth sub-assembly into a fifth sub-assembly by removing the second Germanium-containing layer so that: (i) the III-V material nanowire layer is at least partially suspended above the second handle wafer, and (ii) the SiGe nanowire layer is at least partially suspended above the second handle wafer layer;
    electrically connecting the III-V material nanowire layer to a first set of source/drain components so that the III-V material nanowire layer acts as a gate for an n-type field effect transistor (nFET); and electrically connecting the SiGe nanowire layer to a second set of source/drain components so that the SiGe nanowire layer acts as a gate for a p-type field effect transistor (pFET).

11. The method of claim 10 wherein: the fourth sub-assembly further includes an oxide stop located on the top surface of the second handle wafer and in between the III-V material nanowire layer and the SiGe nanowire layer;
  in the fifth sub-assembly, a first end of the III-V material nanowire layer is supported, at least in part, by the oxide stop; and
  in the fifth sub-assembly, a first end of the SiGe nanowire layer is supported, at least in part, by the oxide stop.

12. The method of claim 10 wherein the second handle wafer is graded to Ge.

13. The method of claim 10 wherein the III-V material used to make the III-V material nanowire layer is at least substantially lattice matched to a material used to make the first Germanium-containing layer.

14. The method of claim 10 wherein a material used to make the second Germanium-containing layer has a higher proportion of Germanium than the SiGe nanowire layer.

15. The method of claim 10 wherein the removal of the second Germanium-containing layer is performed by a wet etch process.

16. The method of claim 10 wherein the removal of the second Germanium-containing layer is performed by a wet etch process without any substantial removal of material from the SiGe nanowire layer.

* * * * *